United States Patent [19]
Huynh-Tran et al.

[11] Patent Number: 5,328,805
[45] Date of Patent: Jul. 12, 1994

[54] AQUEOUS DEVELOPABLE PHOTOSENSITIVE POLYURETHANE-(METH)ACRYLATE

[75] Inventors: Truc-Chi T. Huynh-Tran, Burtonsville, Md.; Ronald J. Kumpfmiller, Marietta, Ga.

[73] Assignee: W. R. Grace & Co.-Conn., New York, N.Y.

[21] Appl. No.: 924,264

[22] Filed: Aug. 28, 1992

[51] Int. Cl.$^5$ .............................................. G03F 7/00
[52] U.S. Cl. .................................... 430/284; 430/281; 430/300; 430/306
[58] Field of Search ................. 430/281, 284, 300, 306

[56] References Cited

U.S. PATENT DOCUMENTS

| | | |
|---|---|---|
| 2,760,863 | 8/1956 | Plambeck . |
| 3,864,133 | 2/1975 | Hisamatsu . |
| 3,960,572 | 6/1976 | Ibata et al. ......................... 430/283 |
| 4,003,751 | 1/1977 | Carder . |
| 4,006,024 | 2/1977 | Ibata et al. ......................... 430/283 |
| 4,023,973 | 5/1977 | Imaizumi . |
| 4,113,592 | 9/1978 | Rybny . |
| 4,210,713 | 7/1980 | Sumiyoshi . |
| 4,221,646 | 9/1980 | Finelli et al. ........................ 430/284 |
| 4,606,994 | 8/1986 | Illers . |
| 4,716,094 | 12/1987 | Minonishi . |
| 4,762,892 | 8/1988 | Koch . |
| 4,888,379 | 12/1989 | Henning . |
| 4,980,108 | 12/1990 | Suzuki . |
| 5,069,999 | 12/1991 | Higashi . |

FOREIGN PATENT DOCUMENTS

| | | |
|---|---|---|
| 0054150 | 10/1981 | European Pat. Off. . |
| 0261910 | 9/1987 | European Pat. Off. . |
| 0263366 | 4/1988 | European Pat. Off. . |
| 0351628 | 7/1989 | European Pat. Off. . |
| 0335399 | 10/1989 | European Pat. Off. . |
| 0367086 | 10/1989 | European Pat. Off. . |
| 0374707 | 12/1990 | European Pat. Off. . |
| 59-113430 | 6/1984 | Japan . |
| 57-23693 | 5/1987 | Japan . |
| 2-1859 | 6/1988 | Japan . |
| 2-4255 | 6/1988 | Japan . |
| 2-46460 | 8/1988 | Japan . |

OTHER PUBLICATIONS

Xiao, H. X., "Urethane Ionomers", 32nd Annual Polyurethane Technical Marketing Conference, Oct. 1–4, 1989, pp. 398–411.
Speckhard, T. A., "Properties of Segmented Polyurethane Zwitterionomer Elastomers", J. Macomol. Sci.–Phys., B 23 (2), 175–199 (1984).
Show-an Chen, "Polyurethane Cationomers, I. Structure-Property Relationships" Journal of Polymer Science, Part B: Polymer Physics, vol. 28, 1499–1514 (1990).
Miller, J. A., "Properties of Polyether-Polyurethane Anionomers", J. Macromol. Sci.-Phys., B 22 (2), 321–341 (1983).
Hsieh, K. H., "Effect of Charge Groups in Polyurethane Ionomers and Blends" Adv. Urethane Sci. Technol., vol. 10, pp. 77–83 (1987).
Hsu, S. L. "Polyurethane Ionomers. I. Structure-Properties; Relationships of Polyurethane Ionomers" Jrnl. of Appl. Polymer Sci., vol. 29, 2467–2479 (1984).
Encyclopedia of Polymer Science and Engineering, John Wiley & Sons (1988), 2d Ed., vol. 13, pp. 259–261.

Primary Examiner—John Kight, III
Assistant Examiner—P. Hampton-Hightower
Attorney, Agent, or Firm—Valerie E. Looper

[57] ABSTRACT

A photopolymer useful in preparing water-developable, solid printing plates is prepared by preparing a urethane prepolymer by reacting polyoxyalkylene diols or polyester diols, or a mixture thereof, with an excess of diisocyanate, followed by chain extending the resulting prepolymer mixture with an alkyldialkanolamine, then reacting the chain-extended product with a hydroxyalkyl(meth)acrylate. The resulting photopolymer is suitably formulated with additional photoactive (meth)acrylate monomers or oligomers and photoinitiator for casting or extrusion on a substrate to form a flexographic printing plate. Following UV exposure of the plate through a negative, unexposed areas can be removed by washing with a slightly acidic aqueous medium, to give a plate with a desirable relief image. The use of the aqueous washout solution as opposed to organic solvents minimizes pollution problems.

15 Claims, No Drawings

AQUEOUS DEVELOPABLE PHOTOSENSITIVE POLYURETHANE-(METH)ACRYLATE

RELATED APPLICATION

U.S. patent application Ser. No. 662,699, filed Mar. 1, 1991, Truc-Chi Thi Huynh-Tran, owned by the common assignee hereof, is directed to aqueous developable photocurable compositions.

FIELD OF THE INVENTION

This invention relates to radiation curable polymers and formulations or compositions containing them, as well as photosensitive articles having solid surfaces or layers prepared from such polymers or formulations. The invention also relates to a process for making and using the polymers and making and using the photosensitive articles.

BACKGROUND OF THE INVENTION

Photocurable polymers and compositions are well known in the art for forming printing plates and other photosensitive or radiation sensitive articles. In the field of radiation sensitive flexographic printing plates, the plates typically comprise a support and a photosensitive surface or layer from a photocurable composition. Additional layers or surfaces on the plate include slip and release films to protect the photosensitive surface. Prior to processing the plate, the additional layers are removed, and the photosensitive surface is exposed to radiation in an imagewise fashion. The unexposed areas of the surface are then removed in developer baths.

Removal of unexposed surfaces comprising solid photocurable compositions such as those disclosed in U.S. Pat. No. 2,760,863 require the use of developer baths comprising environmentally unsafe, organic solvents such as tetrachloroethylene, 2-butanone, benzene, toluene, xylene, trichloroethane and solvent mixtures such as tetrachloroethylene/n-butanol. However, due to the toxicity, high volatility and low flash point, their use gives rise to hazardous conditions and creates pollution problems. Thus, recently there has been a strong interest in the field to develop photosensitive layers in non-organic solvent developing solutions, e.g., aqueous, surfactant-aqueous or alkaline-aqueous solutions. However, the compositions resulting from recent attempts to achieve aqueous developable plates demonstrate deficiencies in mechanical properties, e.g., flexibility. See European Application 261,910.

For instance, in addition to possessing an aqueous developable photosensitive surface, a flexographic printing plate must have sufficient flexibility to wrap around a printing cylinder, yet be strong enough to withstand the rigors experienced during typical printing processes. Further, the printing plate should be soft enough to facilitate ink transfer during printing.

Previous aqueous developable compositions have not possessed all the desirable features such as flexibility, softness and solvent resistance to inks typically used in printing. For example, U.S. Pat. No. 4,023,973 describes a photosensitive composition comprising a maleic anhydride adduct of a 1,2-polybutadiene. However, because the 1,2 content of this material is very high, i.e., 70% or more, this composition has an undesirably high rubber hardness.

Furthermore, other water-developable photosensitive compositions which contain as the main component a high molecular weight polymer such as polyvinyl alcohol, cellulose, polyethylene oxide, or the like, are insufficient in flexibility and possess a high degree of rubber hardness and hence are unsuitable for use in flexographic printing plates.

Finally, it is also important that the photosensitive surface of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See U.S. Pat. No. 4,762,892 to Koch et al. and discussion of low molecular weight polymers disclosed in Japanese Kokoku 57-23693.

Photosensitive formulations using the polymers of this invention are water-developable without presenting any of the aforesaid disadvantages.

Japanese Kokai Patent (A), SHO 59-113430, Disclosure Date Jun. 30, 1984, Sakurai et al., discloses a water-developable printing plate made with a light-sensitive polymer. The polymer is made by chain extending both an isocyanate end capped polyester diol, and an isocyanate-hydroxyl(meth)acrylate adduct with an alkyl diethanolamine. Thus, a chain extended prepolymer terminated with isocyanate (such as Prepolymer III herein) is not made. The final polymer product is quaternized to increase cure speed. The present invention does not require this step. The solid photopolymer IV of the instant invention is not made. In Example 2 of the reference (which appears to be typical of the reference Examples), a mixture of an isocyanate end-capped polyether diol (PEG 1000) and a diisocyanate-hydroxyalkyl(meth)acrylate adduct is chain-extended with N-methyldiethanolamine under conditions leaving no detectable —NCO.

European Patent Application 54,150, filed Oct. 23, 1981, Lehner et al., assigned to BASF, describes a UV-activatable polymer made by first reacting together three components, i.e., a polyether diol, diisocyanate, and alkyldialkanolamine, and reacting that product with an epoxy acrylate. The final polymer product is formulated conventionally with acrylates and photosensitizers for use in water-developable printing plates. Since this reference describes a polymer comprising moieties of polyether diol, diisocyanate, alkyldialkanolamine, and acrylate, it is appropriate to consider it at length. In the Lehner et al. reference, the product is a random copolymer consisting of randomly positioned moieties of polyether polyol, diisocyanate, alkyldialkanolamine, and epoxy-acrylate in various combinations, e.g., B-A-B, B-C-B, B-A-B-C-B, B-A-B-C-B-D-B, etc., where A is polyether diol, B is diisocyanate, C is alkyldialkanolamine and D is an epoxy acrylate. This introduces pendant acrylate groups along the polymer chain. Finally, polymer viscosity is increased to obtain a solid polyurethane-urea by addition of a diamine which forms urea linkages. Lehner et al. did not react epoxyacrylate sequentially. All A, B, C, and D were added at the same time. The Lehner et al. reference does not disclose an isocyanate end-capped polyether diol or polyester diol, chain extended with an alkyl dialkanolamine, with the chain-extended product further end-capped with hydroxyalkyl(meth)acrylate.

This invention differs in other important ways from the Lehner et al. process. (1) It is sequential, that is, the diol is end-capped, then chain-extended at a point in the process prior to terminating with acrylate. (2) The resulting molecule is then terminated with acrylate, whereas the reference reacts an epoxy-acrylate to form pendant groups along the polymer chain. (3) This invention does not utilize urea linkages. (4) This process does not quaternize with glacial acetic acid to make an ionomer. These differences ensure a precise and highly desirable thermoplastic polyurethane elastomer. That is, a structure that will provide the correct predetermined molecular weight and composition and will necessarily result in a printing plate with good physical properties and good aqueous and oil based ink resistance. The reference does not make the products of the instant invention.

U.S. Pat. No. 5,069,999, Higashi et al., "PS Plate for Making Lithographic Plate Requiring No Dampening Water," (1991) discloses a printing place comprising a, photosensitive mixture comprising an acrylate monomer or oligomer and a polyurethane resin made ". . . by reacting a diisocyanate with approximately equimolar amount of a diol or those obtained by reacting a diol with a slight excess of a diisocyanate and then subjecting the reaction product to a chain extending reaction with a diamine, a diol, or water." [Emphasis supplied.] (Col. 4, line 66—Col. 5, line 2.) The reference does not make a solid photopolymer, nor does it discuss or disclose water developability. Further, prepolymer III of the instant invention (a unique chain-extended polyurethane) is not disclosed in the reference. The reference suggests using alkyldialkanolamine or dihydroxy(meth-)acrylate as a diol (Col. 5, lines 37-39). However, the reaction of a hydroxyalkyl-(meth)acrylate with a diisocyanate end-capped polyether diol further chain-extended with alkyldialkanolamine (Polymer IV of the instant invention) is not disclosed in the reference.

U.S. Pat. No. 4,888,379, Henning et al., "Heat-Sensitive Polyurethane Dispersions," (1989) discloses (Example 2) reacting a mixture of polycarbonate polyol and polyethylene oxide-polypropylene oxide polyether polyol with hexamethylene diisocyanate, followed by chain extending the resulting polyurethane with methyldiethanolamine (MDEA). The resulting material was further extended with isophorone diamine in water to form a polyurethane latex or emulsion useful for coatings. The final polyurethane emulsion is not photocurable.

U.S. Pat. No. 4,113,592, Rybny et al., "Trihalogenated Hydrocarbons as Co-Photoinitiators," (1978), teaches the addition of methyldiethanolamine to known photosensitizers to increase cure rate in photosensitizer compositions.

U.S. Pat. No. 4,980,108, Suzuki et al., "Process for Forming a Polyurethane Coated Biaxially Oriented Polyester Film," (1990) teaches introduction of pendant carboxylic groups into a polyurethane prepolymer followed by neutralization with methyl diethanolamine.

U.S. Pat. No. 4,003,751, Carder, C. H., "Coating and Ink Compositions," (1977), teaches reacting together a hydroxy(meth)acrylate, a monohydroxylamine, and an organic diisocyanate all in one step. The result is a mixture of polyurethanes formed from the hydroxy(meth)acrylate and hydroxylamine reacting separately with the diisocyanate. The reaction of a hydroxy(meth)acrylate with chain-extended isocyanate end-capped polyether and/or polyester diols is not disclosed.

U.S. Pat. No. 4,210,713, Sumiyoshi et al., "Photo-Curable Composition for Coating Containing an Unsaturated Urethane Modified Polymer," (1980), discloses a photopolymer made by reacting a diisocyanate with an acrylate. The acrylate can be the mono(meth)acrylic ester of N-methyldiethanolamine.

U.S. Pat. No. 3,864,133, Hisamatsu et al., "Photo-Polymerizable Compositions," (1975) discloses reacting, in specified sequence, a diisocyanate, a polyol, and an acrylate ester, optionally with an amine (e.g., methyldiethanolamine). The amine is said to accelerate hardening in the presence of air. In Example 6 tolylene diisocyanate was reacted with trimethylolpropane, and the result was reacted further with ethylacrylate and 2-hydroxyethylacrylate, followed by addition of triethanolamine. A mixture of acrylates was added as physical diluents to make the final photopolymer mixture. Example 49 discloses the reaction of tolylene diisocyanate with a polyester polyol, followed by reacting the resulting polyurethane with a mixture of methyl methacrylate and hydroxyethylmethacrylate. The result was mixed with triethanolamine. The sequential reaction of diisocyanate plus polyether and/or polyester diols, followed by chain extension with alkyldialkanolamine, followed by reacting with hydroxyalkyl(meth)acrylate is not disclosed.

U.S. Pat. No. 4,606,994, Illers et al., "Process for Producing Photo-cured Printing Plates Possessing a Defined Hardness," (1986) discloses reacting together a polyurethane with an acrylate to put acryloyl side groups on the polyurethane, optionally in the presence of dialkanolamine as chain extender. Prepolymer III and Photopolymer IV of the instant invention (as hereinafter described) are not made. Examples 1-3 describe polyether urethane possessing acrylate side groups prepared from polyethylene oxide polyol, bisphenol-A diglycidyl ether diacrylate, butanediol, cyclohexanedimethanol and hexamethylene diisocyanate. Chain extension of an isocyanate end-capped polyether or polyesterdiol with an alkyldialkanolamine followed by reaction with a hydroxyalkyl(meth)acrylate is not disclosed. Furthermore, the resulting photosensitive plates were developed in alcohol/water mixtures, which are less environmentally safe than this invention which uses dilute solutions of water and surfactants, vinegar or citric acid.

U.S. Pat. No. 4,716,094, Minonishi et al., "Photosensitive Resin Composition Which is Improved with Respect to Surface Tack-Free Characteristic after Curing, and a Method," (1987) suggests (Col. 5) reacting an isocyanate end-capped polyether polyol with a compound having a hydroxyl, carboxyl, or amino group containing unsaturated carboxylic acids or esters to prepare a printing plate prepolymer.

Japanese Kokai Patent, HEI 2-1859, disclosure date, Jan. 8, 1990, Kawahara et al., "Photosensitive Resin Composition," discloses making a photopolymer with a softening point of 45°-80° C. to enhance water developability. This is disclosed to be accomplished by reacting a diisocyanate-capped polyether diol with hydroxyethylmethacrylate. Chain extension with alkyldialkanolamine to form a thermoplastic elastomer polyurethane is not used in the process.

Japanese Kokai Patent (A), HEI 2-4255, of Jan. 9, 1990, Satomi et al., "Light-Sensitive Composition," discloses preparation and use of a urethane acrylate polymer similar to that of Japanese Kokai Patent HEI 2-1859, above, except that a polymeric material is added mechanically to regulate elasticity and hardness after photoexposure.

European Patent 0 367 086 of Jan. 25, 1989, Littmann et al., assigned to BASF AG, discloses a water developable printing plate using a carboxylated polymer with acrylate-terminated chains. Diisocyanate is not used.

European Patent Application, Publication No. 0 351 628 A2, of Jul. 4, 1989, Gersdorf et al., "Photosetting Elastomer Mixture and Recording Material Obtained from It for the Production of Relief Printing Plates," assigned to Hoechst AG, discloses a polyurethane base polymer grafted with a vinyl carboxylate which is later saponified to form acid groups and admixed with acrylates and photosensitizer to make a water-developable printing plate. There are no alkyldialkanolamine or acrylate groups in the base polyurethane chain.

In European Patent 374,707 of Dec. 13, 1989, Gersdorf et al., "Photocurable Elastomer Mixture Containing Polyurethane, Unsaturated Monomer and Initiator, Useful for Printing Plate and Photoresist Production," assigned to Hoechst AG, the mixture formulated for printing plates comprises polyurethane grafted with a vinyl carboxylate, plus acrylate diluent and photosensitizer. The exposed plate is water-developable.

Japanese Kokai Patent (A), HEI 2-46460, of Feb. 15, 1990, Tomita et al., "Light Sensitive Resin Composition," discloses a polyurethane prepolymer treated with dimethylolpropionic acid to yield a further polyether urethane, which, with other polyether urethanes, is mixed with acrylate and photosensitizer in the preparation of a water-developable plate. The base photopolymer molecule did not contain either alkyldialkanolamine or acrylate.

Xiao, H. X., et al., "Urethane Ionomers," 32nd Annual Polyurethane Technical Marketing Conference, Oct. 1-4, 1989, pp. 398-411, discloses reacting diisocyanate with polyether diol, followed by reaction with methyldiethanolamine until the mixture showed zero isocyanate. The resulting chain-extended prepolymer thus had no molecules terminated by isocyanate, as required in Prepolymer III of the instant invention, and the final polyurethane does not contain any photocurable sites.

Speckhard, T. A., et al., "Properties of Segmented Polyurethane Zwitterionomer Elastomers," *J. Macromol. Sci.-Phys.*, B 23 (2), 175-199 (1984), discloses (Scheme 1, p. 178), the reaction of methyldiethanolamine directly with isocyanate-capped polyether diol in the absence of free diisocyanate. No polyurethane prepolymer of the type diisocyanate/methyldiethanolamine/diisocyanate is made, as required in the instant invention, and the product as chain-extended with methyldiethanolamine is shown as terminating in hydroxyl, not isocyanate. And there is no acrylate terminator. The final polymer is not a photopolymer.

Show-an Chen, et al., "Polyurethane Cationomers, I. Structure-Property Relationships, "Journal of Polymer Science, Part B: Polymer Physics, Vol. 28, 1499-1514 (1990), discloses (p. 1500) reacting polyether diol with an excess of toluene diisocyanate, followed by reaction with methyldiethanolamine, until the reaction mixture tests zero isocyanate, thus indicating absence of isocyanate terminated molecules. (The instant invention requires isocyanate terminated prepolymer at this stage, defined as Prepolymer III. There are no acrylate groups in the reference polymer.

Miller, J. A., et al., "Properties of Polyether-Polyurethane Anionomers," *J. Macromol Sci-Phys.*, B 22 (2), 321-341 (1983). This reference discloses (p. 325) endcapping polyether polyol with an excess of diisocyanate, followed by chain extension with methyldiethanolamine. The latter reaction is continued until the reaction mixture shows zero isocyanate, thereby forming a prepolymer without terminal isocyanate groups. (At this stage the instant invention requires isocyanate terminated prepolymer Prepolymer III, as hereinafter defined.)

Hsieh, K. H., et al., "Effect of Charge Groups in Polyurethane Ionomers and Blends," *Adv. Urethane Sci Technol.*, vol. 10, pp. 77-83 (1987). Page 79 discloses casting a physical mixture of isocyanate capped polyether polyol and methyldiethanolamine in a mold at 70° C.

Hsu, S. L., et al., "Polyurethane Ionomers. I. Structure-Properties; Relationships of Polyurethane Ionomers," *Journal of Applied Polymer Science, Vol.* 29, 2467-2479 (1984), describes end-capping polyether diol with diisocyanate, followed by reaction with methyldiethanolamine. The reaction was stopped when the reaction mixture showed zero isocyanate (p. 2468), indicating that the resulting prepolymer was not terminated with isocyanates. (At this stage the instant invention requires isocyanate terminated prepolymer, Prepolymer III as hereinafter defined.) Preparation of a photocurable polymer with acrylate groups was not disclosed.

*Encyclopedia of Polymer Science and Engineering*, John Wiley & Sons (1988), 2d Ed., Vol. 13, pp. 259-261, discloses the general reaction of isocyanates with polyester polyols to form polyurethanes.

SUMMARY OF THE INVENTION

A polyether diol (polyoxyalkylene diol) optionally with a polyester diol is end-capped with an excess of a diisocyanate, the resulting isocyanate capped polyurethane is chain-extended with a alkyldialkanolamine, and the chain-extended polymer is reacted with hydroxyalkyl(meth)acrylate to terminate the polymer chains with (meth)acrylates. One of ordinary skill in the art will recognize that, in addition to the polyether diols and the polyester diols discussed above, various blends of diols may be utilized. The final polymer product is photosensitive (photocurable) and can be formulated with photosensitizer and (meth)acrylate diluents to make water-developable printing plates, photoresists, and the like.

Key features of the invention include (inter alia):
(1) The final photopolymer is a solid. This means there is no cold flow in formulated printing plates, which remain dimensionally and thermally stable.
(2) The photopolymer synthesis uses a dialkanolamine, thereby integrating an amine into the polymer chain, resulting in water dispersibility.
(3) The photopolymer has terminal (meth)acrylate groups for UV curability.

OBJECTS OF THE INVENTION

It is an object of the invention to prepare a novel solid water-dispersible polymer of predetermined sequentially designed structure which can be crosslinked or cured by exposure to actinic radiation.

A further object is to make a water-developable storage-stable flexographic relief printing plate.

A still further object is to make a printing plate that can be developed in aqueous solutions that are harmless to the environment.

Another object is to synthesize a solid water-dispersible, UV-sensitive polymer suitable for printing plate use wherein elements that provide water-dispersibility and UV-sensitivity are in the same molecule.

It is an object of the invention to provide a photosensitive article comprising a novel photocurable composition.

Another object is to synthesize a novel urethane prepolymer (herein Prepolymer III, or simply III) especially designed for reaction with a hydroxyalkyl(meth)acrylate.

Another object is to provide a novel (meth)acrylate-terminated polyurethane (herein, Photopolymer IV, or simply IV).

Another object is to chain-extend an isocyanate-capped polyether diol or isocyanate-capped polyester diol or mixture thereof, with alkyldialkanolamine, followed by terminating the resulting polymer chain by reaction with hydroxyalkyl(meth)acrylate.

Another object is to prepare a flexographic relief printing plate that will not swell unduly in conventional aqueous- or oil-based inks.

Unless otherwise indicated the term "(meth)acrylate" means either acrylate or methacrylate.

Molecular weights are number average, $M_n$, as determined by Gel Permeation Chromatography using polystyrene standards.

DETAILED DESCRIPTION

Overview

The main reactions and products involved in the invention are given schematically and simplistically as follows:

1. $P + Cy \rightarrow (Cy-P)_x-Cy$ (I);
2. $N + Cy \rightarrow (Cy-N)_y-Cy$ (II);
3. $I + N + II \rightarrow [(Cy-P)_x-(Cy-N)_y]_z-Cy$ (Prepolymer III, or III);

(Note: Reactions 2. and 3. go forward together.)

$III + A \rightarrow A-[(CY-P)_x-(CY-N)_y]_z-Cy-A$ (Photopolymer IV, or IV, where P is a polyether diol or polyester diol or their moieties, Cy is a diisocyanate or its moiety, N is an alkyldialkanolamine or its moiety, and A is a hydroxyalkyl(meth)acrylate or its moiety. In these reactions hydroxyl containing compounds are linked to diisocyanate containing compounds via urethane linkages, —NH—C(:O)—O—, to form the respective moieties. x, y, and z may differ from molecule to molecule, but are such that the over-all molecular weight of Prepolymer III, whether made from polyether diol or polyester diol or their mixtures, as in the range of about 5,000–60,000 (preferably about 5,000–30,000), and that of Photopolymer IV is in the range of about 5,000–60,000 (preferably about 7,000–40,000). Segments of I and II may be positioned randomly in the chain. The aforesaid 4 reactions may be restated explicitly. In this restatement the mole ratio of P:Cy:N:A must be 1:1.3–8:0.2–7:0.1–3, preferably 1:1.5–6:0.4–5:0.2–1.

Depending on the molecular weight of the polyols (in this case polyether, polyester, polycaprolactone or polycarbonate polyols or mixtures of polyols), it is preferable to select the molar ratio of the reactants P (for polyols), Cy (for diisocyanate), N (for alkyldialkanolamine) and A for hydroxyalkyl(meth)acrylate such that: (weight percent as cited below is based on the total weight of the final photopolymer):

(a) the total polyol content is preferably between 60 and 80 weight percent in order for the final photopolymer to have good flexibility or elastomeric properties and (b) the alkyldialkanolamine content is preferably 1–10 weight percent in order to maintain good water developability and (c) the hydroxyalkyl(meth)acrylate content is preferably 0.8–2 weight percent so that good photocurability and hence good resistance to ink swell can be achieved.

1. Reaction of polyether or polyester diol (P) with the aforestated stoichiometric excess of diisocyanate (Cy):

(i) In the case of polyether diol:

$$HO-(-A-O-)_bH + \text{excess}$$
$$OCNR^1NCO \rightarrow OCN-B-R^1-NCO \quad (I-i)$$

where

A is —CH$_2$CH$_2$—, —CH$_2$CH$_2$CH$_2$—, —CH$_2$CH(CH$_3$)—, —CH$_2$CH$_2$CH$_2$CH$_2$—, —CH$_2$CH$_2$CH(CH$_3$)—, or —CH$_2$CH(CH$_3$)CH$_2$—;

B represents one or more segments of
[—R$^1$—NH—C(:O)O(—A—O—)$_b$C(:O)NH—]

b is determined by the molecular weight of the polyether diol and is discussed in the description of polyether diol, below.

R$^1$ is a divalent aromatic, aliphatic, or cycloaliphatic group containing 2–20 carbons, preferably 5–15.

(ii) In the case of polyester diol:

$$HO-D-R^2OH + \text{excess } OCNR^1NCO \rightarrow OCN-R^1-E-NCO \quad (I-ii)$$

where

D represents repeating segments of [—R$^2$—O—C(:O)—[(R$^3$)$_{0\text{ or }1}$]-C(:O)O—], E represents one or more segments of [—NHC(:O)—O—D—R$^2$O—C(:O)—NH—R$^1$—]

R$^2$ is a divalent aliphatic, cycloaliphatic, or alpharyl group of 2–20 carbons;

R$^3$, when present (i e, when R$^3$ is 1), is a divalent aliphatic, cycloaliphatic, aryl or alpharyl group of 1–22 carbons.

When mixtures of polyether diols and polyester diols are used, the diols can be used in any ratio.

These end-capping reactions are well known. As indicated, the terminal isocyanates on initially formed end-capped diols may react with other hydroxyl groups on other polyether or polyester diols, thereby increasing over-all molecular weight of the resulting polyurethane. This reaction is suitably carried out at conventional temperatures, e.g., within the range of about 25°–80° C.

Chain extension of prepolymer product (I-i and/or I-ii) with alkyldialkanolamine (HO—R$^4$—R$^5$—R$^6$—OH). In this operation, Reactions 2 and 3 go forward together, the product II of Reaction 2 serving as an intermediate in Reaction 3:

2.
$$OCN-R^1-OCN + HO-R^4-R^5-R^6-OH \rightarrow OCN-F-R^1-NCO \quad (II)$$

where

F represents one or more segments of [—R$^1$—NH—C(:O)—O—R$^4$—R$^5$—R$^6$—O—C(:O)NH—]

R$^4$ and R$^6$ are the same or different alkylene groups with 1–6 carbons; or R$^4$ can be —(CH$_2$CH$_2$O)$_d$CH$_2$CH$_2$—provided R$^6$ is —(CH$_2$CH$_2$O)$_e$CH$_2$CH$_2$—, where d and e are each 0–9 and d+e=3–15;

$R^5$ is —N($R^7$)—,

or —N(Ph)—; (Ph=phenyl)

$R^7$ is an alkyl group with 1-6 carbons.

3. $I + HO—R^4—R^5—R^6—OH + II \rightarrow OCN—R—R^1—NCO$ (Prepolymer III, or III), where R comprises one or more segments of B and/or one or more segments of E; and one or more segments of F; which is to say, R comprises B, E, and F; or R consists essentially of B and F; or R consists essentially of B and E.

Reactions 2 and 3 are carried out in the same reaction mixture substantially simultaneously, at a temperature in the range of about 25°-60° C., until all of the hydroxyl groups have reacted as determined by titration of the remaining isocyanate. As indicated, individual polymer chains in III may be expected to vary in the number of polyether diol, polyester diol, diisocyanate, and alkyldialkanolamine moieties. The reactant proportions are controlled within the ranges stated above so that all or substantially all polymer chains will terminate in isocyanate. This condition is essential for the fourth (and final) step. A small amount of residual free diisocyanate may be left after the formation of III.

In Reactions 2 and 3, note that the molar ratio, Cy/(P+N), is always >1.

Within IIIa preferred structure results when
$R^1$ is 4,4'-methylene diphenylene (MDI)
$R^4$ and $R^6$ are ethylene;
$R^5$ is —N(RT)—;
$R^7$ is methyl;
the diols include a mixture of an ethylene oxide end-capped polyoxypropylene diol and a polypropylene adipate diol where (—A—O—)$_b$ has a molecular weight of about 1000-3500.

Prepolymer III and the herein described processes for synthesizing it are considered novel.

Reaction 4. Reaction of chain-extended polymer (Prepolymer III) with hydroxyalkyl(meth)acrylate to give Photopolymer IV:

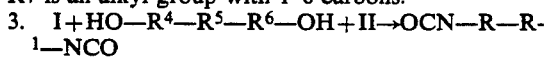

(Photopolymer IV), where
G is $CH_2=C(R^9)—C(:O)—O—R^8—O—C(:O)—NH—$,
$R^8$ is 1-7 carbon alkylene, and
$R^9$ is H or methyl.

Within IV a preferred structure results when
$R^1$ is MDI;
$R^4$, $R^6$, and $R^8$ are ethylene;
$R^7$ and $R^9$ are methyl;
$R^5$ is —N($R^7$)—;
the diols include a mixture of an ethylene oxide end-capped polyoxypropylene diol and a polypropylene adipate diol where;
(A—O—)$_b$ has a molecular weight of about 1000-3500.

The relationship of III and IV is readily evident in the structure J—R—$R^1$—J' where the J's are identical and are either —NCO (giving III), or G (giving IV).

This Reaction 4 is suitably carried out at a temperature in the range of about 60°-80° C. and is conveniently carried out following chain extension Reactions 2 and 3, in the same vessel. Consistent with III, Segments B and/or E, and F may be positioned at random in the polymer chains of IV. As indicated, most of the molecules comprise multiple moieties of polyether (and/or polyester) diol, end-capping diisocyanate, and chain-extending dialkanolamine, with all or substantially all polymer molecules of IV being terminated with alkylene(meth)acrylate.

The reactions described above can be carried out without a solvent, but preferably are carried out in an anhydrous organic solvent. Suitable solvents include methyl ethyl ketone, methyl isobutyl ketone, toluene, and mixtures thereof. The solvents should have a boiling point in the range of 80°-120° C. for easy casting of films and evaporation of solvent.

The following is a further description of the reactants.

The Diol (a) Polyether Diol

This product has the structure HO—(A—O)$_b$H where A is a divalent radical of ethylene, propylene, isopropylene, butylene, isobutylene; and b is such that the number average molecular weight of the group [A—O]$_b$, or of the polymer diol (which is substantially the same thing) is within the range of about 650-7,000, preferably about 1,000-3,500. Polypropylene oxide glycol, MW about 1,000-3,500, or polypropylene oxide/ethylene oxide end-capped, MW about 1,000-3,500, are especially preferred. The polyether diol reactants may be made by processes well known in the art by reacting an alkylene oxide or mixtures of alkylene oxides with a compound having at least one active hydrogen atom, such as water; monohydroxylic alcohols such as ethanol and propanol; and dihydroxylic alcohols such as ethylene glycol and monoethyl ether of glycerine. The poly(oxyalkylene) products of such reactions will have linear oxyalkylene or oxyethylene-higher oxyalkylene chains, and such chains will terminate with hydroxyl groups.

(b) Polyester Diol

As noted, the polyester diol, HO—D—$R^2$OH, where D and $R^2$ have the values above given, may be used alone or in admixture with polyether diols. Suitable polyester diols include those made from dibasic acids or caprolactones with an excess of glycol. The dibasic acids, which are preferred, are those of the structure HO—C(:O)—[($R^3$)$_{0\ or\ 1}$]—C(:O)OH, with an excess of glycol of the structure HO—$R^2$—OH where $R^2$ and $R^3$ are as above defined.

The molecular weight of D (or of the polyester diol, which is substantially the same thing) should be about 600-6,000, preferably about 1,000-3,500.

Suitable dibasic acids include those of the saturated series, i.e., oxalic, malonic, succinic, glutaric, adipic, pimelic, suberic, and the like. In this group, adipic acid is preferred. Aromatic dibasic acids include phthalic and terephthalic acids. In lieu of the acid itself, the anhydride may be used, e.g., phthalic anhydride, or its ester may be used, e.g., methyl terephthalate. Acid mixtures may be used. When $R^3$ is zero the acid is of course oxalic. When $R^3$ is "1," $R^3$ contains 1-20 carbons and the subsequent dibasic acid contains 3-22 carbons.

Suitable glycols for making the polyester diol include the alkylene glycols, e.g., ethylene glycol, propylene glycol, trimethylene glycol, the three butane diols, tetramethylene glycol, isobutylene glycol, pinacol, and the like, including their mixtures. The diol may have a cycloalkane structure or alkyl aromatic structure.

Useful polyester diols made from adipic acid include poly(diethylene adipate) diol, poly(ethylene adipate) diol, poly(propylene adipate) diol, poly(propylene/ethylene) adipate diol, poly(butylene adipate) diol, poly(ethylene/butylene adipate) diol, poly(neopentyl adipate) diol, poly(hexane/neopentyl) adipate diol, poly(hexane adipate) diol, polycaprolactone diols and the like or mixtures thereof.

Processes for making polyester diols are well known. See, for example, *Encyclopedia of Polymer Science and Engineering*, John Wiley & Sons (1988), 2d Ed., Vol. 12, pp. 28-42, especially pp. 33-34; and Vol. 13, pp. 259-261.

The Diisocyanate

A wide variety of diisocyanates is available for end-capping the polyether diol. These diisocyanates can be aliphatic, cycloaliphatic, or aromatic, with the structure OCN—$R^1$NCO. The divalent radical $R^1$ contains in general 2 to 20, preferably 6 to 15, carbon atoms and may optionally carry non-interfering substituents such as ether groups, ester groups, urethane groups, amido groups, urea groups, aryl groups, aliphatic groups, cycloaliphatic groups, or halogen atoms. Examples of suitable diisocyanates include 4,4'-methylene diphenyl diisocyanate (MDI), 2,4-tolylene diisocyanate (toluene diisocyanate), 2,6-tolylene diisocyanate, mixtures of the two latter isomers, dimer of 2,4-tolylene diisocyanate, p-xylene diisocyanate, m-xylene diisocyanate, 1,5-naphthylene diisocyanate, 3,3'-dimethylbiphenyl-,4,4'-diisocyanate, hexamethylene diisocyanate, trimethylhexamethylene diisocyanate, lysine diisocyanate, isophorone diisocyanate, 4,4'-methylenebis(cyclohexylisocyanate), methylcyclohexane-2,4 (or 2,6)-diisocyanate, 1,3-(isocyanatomethyl)cyclohexane, and m-tetramethylxylene diisocyanate.

Conventional urethane-forming catalysts may be used in the reactions with diisocyanates. These catalysts include, e.g., organo-tin compounds such as dibutyl tin dilaurate and stannous octoate, organo-mercury compounds, tertiary amines, and mixtures of these materials.

Alkyldialkanolamine

This material has the structure HO$R^4R^5R^6$OH, where the numbered R's are as above defined. Within this group, methyldiethanolamine, bis(hydroxyethyl)piperazine,

and N,N'-Bis(2-hydroxypropyl)aniline, HO—CH(CH$_3$)CH$_2$—N(Ph)—CH$_2$CH(CH$_3$)OH are preferred. (Ph - phenyl.)

Hydroxyalkyl(meth)acrylate

This material has the structure HO—$R^8$OC(:O)—C($R^9$)=CH$_2$, where the R's are as above defined. Within this structure hydroxyethylmethacrylate is preferred.

Formulations with the Invention Photopolymer

The simplest formulation is the invention photopolymer plus an effective amount of photoinitiator. Such mixture can be solvent cast, as is, or the solvent removed and the mixture extruded to create a solid photopolymerizable layer on conventional backing materials. However, for many commercial uses it will be found preferable to formulate or extend the photopolymerizable composition with about 1 to 30% by weight of reactive (i.e., photoactive) monomer or oligomer, and most preferably in the range of 5 to 15% by weight reactive monomer. Suitable reactive monomers or oligomers are those of the formula:

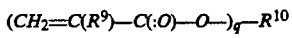

where $R^9$ is H or methyl, $R^{10}$ is an organic moiety having a valence of q, and q is an integer.

Such reactive (meth)acrylate diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethoxylated bisphenol-A diacrylate, propylene glycol mono/dimethacrylate, trimethylolpropane diacrylate, di-trimethylolpropane tetraacrylate, triacrylate of tris(hydroxyethyl) isocyanurate, dipentaerythritol hydroxypentaacrylate, pentaerythritol triacrylate, ethoxylated trimethylolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate, urethane-methacrylate or acrylate oligomers and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents, as well as methacrylate oligomers such as epoxy acrylates, urethane acrylates, and polyester or polyether acrylates.

Photoinitiators

The formulations comprising the novel materials of this invention require a photoinitiator. A large number are available and useful.

Photoinitiators for the photopolymerizable composition and formulations containing the same include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e., Irgacure®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acetophenone, o-methoxybenzophenone, acetonaphthalene-quinone, methyl ethyl ketone, valerophenone, hexanophenone, alpha-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butedione, acetonaphthene, benz[a]anthracene 7.12 diene, etc. Phosphines such as triphenylphosphine and tri-o-tolyl-phosphine are also operable herein as photoinitiators. The photoinitiators or mixtures thereof are usually added in an amount ranging from 0.01 to 5% by weight of the total composition.

Other Additives

Other additives to the photocurable composition can be included. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine, phosphites, nitrobenzene and phenolic-thio compounds, and mixtures thereof. Such additives are used in an amount within the range of from about 0.01 to about 4% by weight of the prepolymer. These stabilizers are effective in preventing crosslinking of the prepolymer composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

Formulations using the photopolymers of this invention include the following (in parts by weight):

(1) Photopolymer, about 50–100, preferably about 70–90;
(2) A mono-, di-, or multi-acrylate diluent, which can be a monomer or oligomer, about 0–25, preferably about 5–15;
(3) Photoinitiator, about 0.1–10, preferably about 0.5–2.0;
(4) Organic solvent, 0 to about 200, preferably about 10–50.

Preparation of Plate

The photocurable composition can then be shaped and formed as a solid layer of suitable thickness according to conventional solvent casting, i.e., dissolving the composition in a solvent, shaping the solution into a film or plate and removing the solvent. Conventional extrusion, calendaring or hot press techniques can also be used. Solid layers of the photosensitive composition in the form of a film can be adhered to supports such as those comprising polyester, nylon or polycarbonate. Other suitable supports include woven fabrics and mats., e.g., glass fiber fabrics or laminated materials made of, for example, glass fibers and plastics, and steel or aluminum coated plates. It is preferred that the supports are dimensionally stable and resistant to the washout solutions.

It is also usually necessary to protect photosensitive surfaces from contamination by dirt and dust during storage before being exposed and washed. Such protection is accomplished by lamination or application of a flexible protective cover sheet to the side of the photocurable composition opposite that of the support. In addition, the photocurable compositions can sometimes be tacky and it is thus also desirable to apply a release film to the surface of the photosensitive layer before application of the coversheet. The release film consists of a thin, flexible and water soluble polymeric film and allows for intimate contact between the surface of the photocurable composition opposite to the support and an image-bearing negative applied to the surface.

Exposure and Development

Photosensitive articles comprising a support having a solid layer or surface comprising the photocurable composition, e.g., solid flexographic printing plates, can then be processed by well-known techniques for imagewise exposure to actinic light. Preferably, the light should have a wavelength of from about 230–450 microns. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 1 to 20 minute exposures are preferred.

Development

After exposure and removal of the negative, the unexposed areas of the photosensitive surface can be developed (removed) in aqueous washout solutions as herein described. This feature is particularly advantageous in that it avoids problems of disposing of washout solutions containing commonly used organic solvents, such as chlorinated solvents, alcohols, or ketones. The washout solution should be slightly acidic and may contain a surfactant. Dilute vinegar or citric acid solutions are preferred. Useful acidic surfactants include sodium alkynaphthalene-sulfonate, sodium alkylbenzene sulfonate, sodium alkyl ether sulfate, polyoxyalkylated alkylaryl phosphate ester sodium salt and the like. Overall additive concentrations are suitably 0.1–5%. Wash temperature can vary from 25°–70° C. preferably at ambient temperature. Following washout, the plate may be post-exposed for further hardening of the relief work.

EXAMPLES

The following examples illustrate without limiting the invention.

The raw materials used in the examples are described below:

| Item | Description |
|---|---|
| TDI | Toluene (or tolylene) diisocyanate, 2,4 and 2,6-80/20 isomer mixture from Aldrich Chemical Co., Inc. |
| Isonate 2181 | Modified 4,4'-methylene diphenyl diisocyanate from Dow Chemical Co., % NCO = 23. |
| PPG 1025 | Polypropylene oxide diol from Arco Chemical Co.; MW = 1000. |
| PPG 3025 | Polypropylene oxide diol from Arco |

-continued

| Item | Description |
|---|---|
| | Chemical Co.; MW = 3000. |
| Poly G 55-112 | Polypropylene oxide/ethylene oxide diol from Olin Chemical Co., MW = 1000. |
| Poly G 55-37 | ethylene oxide end-capped polyoxypropylene diol, MW = 3000. |
| S-108-46 | Rucoflex S-108-46 is polypropylene adipate diol from Ruco Polymer Corporation, MW = 2400. |
| Irganox 1520 | 2,4-bis[(octylthio)methyl]-o-cresol used as stabilizer, from Ciba-Geigy Corp. |
| Irgacure 65 | 2,2-dimethoxy-2-phenylacetophenone, from Ciba-Geigy Corp. |

EXAMPLE 1

166 g (0.95 moles) of TDI, 60 g of toluene, 160 g (0.16 moles) of a diol PPG 1025 and 43.2 g (0.05 moles) of a diol Poly G 55-112 were charged into a 2-liter resin kettle equipped with a nitrogen purge, air stirrer and thermocouple. The reaction mixture was kept at 35°–40° C. for 19 hours until an isocyanate content of 3.4 milliequivalents per gram of solution was reached. Then 19.2 g of Irganox 1520, 28 g of methyl ethyl ketone and 41 g of toluene were added. A solution containing 76 g (0.64 moles) of methyldiethanolamine, 28 g of methyl ethyl ketone and 92 g of toluene was then added to the reaction mixture in five portions over a period of 2.5-3 hours. At this point, an isocyanate content of 0.29 milliequivalents per gram was obtained. 27.6 g (0.2 moles) of hydroxyethylmethacrylate was then introduced into the reaction vessel and the temperature was raised to 60°–70° C. The reaction was allowed to proceed for about 3-4 hours until the IR spectrum showed the absence of an isocyanate peak at about 2260 cm$^{-1}$. 50 g of ethanol may also be added to react with any trace amount of residual isocyanates left.

To 291 g of this polymer solution, 9.2 g of polypropylene glycol monomethacrylate and 1.9 g of Irgacure 651 were added and mixed well. The solution was cast on a steel coated plate and dried, resulting in a solid, transparent polymer. A polyester coversheet coated with a hydroxyethylcellulose based release film was then laminated onto the top of the dry photopolymer. The photopolymer plate was then imaged for 5 minutes and developed in a 0.25% acetic acid solution to yield a printing plate with good reproduction of the negative film. A 20 mil thick cured film of the above formulation exposed for 5 minutes has the following properties: tensile strength of 1288 psi, modulus of 450 psi, elongation of 408%, Shore A of 72, resilience of 21 and 24-hour ambient temperature swell in water, and aqueous based ink of 8.7% and 9.8%, respectively.

EXAMPLE 2

150 grams (0.86 moles) of TDI was charged to a 1-liter resin kettle purged with nitrogen. A mixture of 163 grams (0.163 moles) of polyoxypropylene glycol (PPG-1025) and 28.5 grams (0,029 moles) of polyoxypropylene/ethylene oxide end-capped diol (Poly G 55-112) was added to TDI under stirring and then mixed for about 17 hours until 3.9 milliequivalents of isocyanate per gram of solution are left as determined by titration. 17.4 grams of Irganox 1520 dissolved in 15 grams of methyl ethyl ketone and 107.5 grams of toluene were then added to the reaction mixture. Then a solution of 68.5 grams (0.57 moles) of methyldiethanolamine in 15 grams of methyl ethyl ketone and 107.5 grams of toluene was added dropwise to the reaction mixture and then allowed to react for about 4 hours until the isocyanate content reached 0.28 milliequivalents per gram. 25 grams (0.19 moles) of hydroxyethylmethacrylate was then added and the reaction mixture was heated to 65° C. After about 3 hours at 65° C, when the IR spectrum showed only that residual traces of isocyanate are left, 30 grams of ethanol was added to the reaction mixture to react with all the remaining isocyanates.

500 grams of the polymer solution was mixed with 15.5 grams of polypropyleneglycol monomethacrylate and 15.5 grams of lauryl methacrylate and 3.4 grams of 2,2-dimethoxy-2-phenyl-acetophenone (Irgacure 651 from Ciba-Geigy) and cast onto a steel coated substrate. The film was prepared and imaged as described in Example 1. The exposed film can be developed at 70° C. in a 4% aqueous solution of a polyoxyalkylated alkylaryl phosphate ester sodium salt surfactant to give a good relief image. The 20 mil thick cured film of the above formulation had tensile strength of 1641 psi, modulus of 1152 psi, elongation of 279%, Shore A of 84, resilience of 24 and good resistance to ink swell (only 6% swell and 7.2% swell in water and aqueous ink, respectively, when soaked for 24 hours at room temperature).

EXAMPLE 3

100 g (0.266 moles) of Isonate 2181, 142.7 g (0.048 moles) of a polydiol Poly G 55-37 and 144.7 g (0.048 moles) of a polydiol PPG 3025 were charged to a 1-liter resin kettle purged with nitrogen and equipped with a thermocouple and an air stirrer. The reaction was allowed to stir to react at 50°–60° C. until the isocyanate content reached 0.87 milliequivalents per gram of solution. Then 100 g of toluene, 50 g of methyl ethyl ketone and 8.2 g of Irganox 1520 (stabilizer) were added. Subsequently, a solution containing 17.8 g (0.149 moles) of methyldiethanolamine in 80 g of toluene and 20 g of methyl ethyl ketone were added over a time period of 45 minutes and the reaction was stirred for about 2.5 hours after which 5 g (0.04 moles) of hydroxyethylmethacrylate was added. The reaction was stirred for about 15 hours and then heated to 70° C. for about 4 hours until the IR spectrum showed the absence of isocyanate.

200 g of the polymer solution prepared above were then mixed with 11 g of trimethylolpropane trimethacrylate, 1.1 g of Irgacure 651 (photoinitiator) and 40 g of toluene and then solvent cast on a coated steel plate. The dry photopolymer film was then laminated on the top with a cover sheet containing a water soluble release film. The coversheet was removed and then the photopolymer plate was imaged through a negative and then developed in a 0.5% citric acid solution to give a good relief image with good reproduction of the negative, useful as a printing plate. A 20-mil thick, cured film of the photopolymer gave tensile strength of 876 psi, modulus of 422 psi, elongation of 186%, Shore A of 65, resilience of 20 and 24-hour ambient temperature swell in water, aqueous ink and oil based ink of 6.9%, 9% and 16 3%, respectively.

EXAMPLE 4

200 g (0.532 moles) of Isonate 2181, 392.6 g (0.133 moles) of a polyether diol Poly G 55-37 and 108.2 g (0.044 moles) of a polyester diol S-108-46 were charged to a 2-liter resin kettle and heated to 50°–60° C. under nitrogen with vigorous stirring. The reaction mixture was allowed to proceed until an isocyanate content of 1.0 milliequivalent per gram of solution was attained. Then 305.6 g of toluene and 76.4 g of methyl ethyl ketone were added to the reaction mixture. A solution of 37 g (0.31 moles) of methyldiethanolamine dissolved in 152.8 g of toluene and 38 g of methyl ethyl ketone was added. The reaction was mixed for about 4 hours until about 0.06 milliequivalents of isocyanate per gram of solution was left. Then 15 g of Irganox 1520 along with 11.6 g (0.09 moles) of hydroxyethylmethacrylate, 312.8 g of toluene and 78.4 g of methyl ethyl ketone were added. The reaction was mixed under vigorous stirring at 40°-50° C. until no more isocyanate could be detected by IR spectroscopy.

A formulation comprising 150 g of the polymer solution obtained above, 3.3 g of an ethoxylated trimethylolpropane trimethacrylate (available from Sartomer as SR 9035), 3.3 g diethyleneglycol dimethacrylate and 0.73 g of Irgacure 651 was solvent cast and dried to obtain a dry photopolymer layer. A water soluble release coating was then applied to the top of the photopolymer plate. The plate was then imaged and developed in 0.5% citric acid solution at ambient temperature to give a printing plate with a relief image having good reproduction of the negative. A 20-mil thick dried and cured film of the formulated polymer gave tensile strength of 348 psi, modulus of 176 psi, elongation of 254%, Shore A of 44 and resilience of 19. The film also had good resistance to ink swell of 10.8%, 13.9% in water, and aqueous based ink, respectively.

What is claimed:

1. Printing plate comprising a substrate and a layer of UV-curable composition thereon, where the composition comprises, in parts by weight,
   Photopolymer, about 50-100;
   Reactive diluent, 0 to about 25;
   Photoinitiator, about 0.1-10;
   wherein the photopolymer comprises G—R—R$^1$—G, where
   R comprises B or E, or mixtures thereof; and F;
   A is —CH$_2$CH$_2$—, —CH$_2$CH(CH$_3$)—, —CH$_2$CH$_2$CH$_2$CH$_2$—, —CH$_2$CH$_2$CH(CH$_3$)—, or —CH$_2$CH(CH$_3$)CH$_2$—;
   B is; ,
   D is, or —R—O— and has a number average molecular weight of about 600-6000;
   E is,
   F is,
   G is CH$_2$=C(R$^9$)—C(:O)—O—R$^8$—O—C(:O)—NH—;
   R$^1$ is a divalent aromatic, aliphatic, or cycloaliphatic group containing 2-20 carbons;
   R$^2$ is a divalent aliphatic, cycloaliphatic, or alpharyl group of 2-20 carbons;
   R$^3$ is a divalent aliphatic, cycloaliphatic, aryl, or alpharyl group of 1-20 carbons;
   R$^4$ and R$^6$ are the same or different alkylene groups with 1-6 carbons; or R$^4$ can be —(CH$_2$CH$_2$O)$_d$CH$_2$CH$_2$—, provided R$^6$ is —(CH$_2$CH$_2$O)$_e$CH$_2$CH$_2$—, where d and e are each 0-9 and d+e=3-15;
   R$^5$ is —N(R$^7$)—, —N N—, or —(Ph)—;
   R$^7$ is an alkyl group with 1-6 carbons;
   R$^8$ is 1-7 carbon alkylene;
   R$^9$ is H or methyl;
   (A—O)$_b$ has a number average molecular weight of about 650°-7000°.

2. Printing plate according to claim 1 comprising
   Photopolymer, about 70-90;
   Acrylate diluent, about 5-10;
   Photoinitiator, about 0.5-2.0.

3. Printing plate according to claim 2 where
   R$^1$ is tolylene or methylene diphenylene;
   R$^4$, R$^6$, and R$^8$ are ethylene;
   R$^7$ and R$^9$ are methyl;
   R$^5$ is —N(R$^7$)—;
   (A—O)$_b$ has a number average molecular weight of about 1000-3500.

4. Printing plate according to claim 3 where (A—O)$_b$ is a moiety of polypropylene ether diol of number average molecular weight about 1000 or of a 3/1 molar polypropylene oxide/ethylene oxide end-capped diol, number average molecular weight about 1000.

5. A printing plate made by making a mixture, comprising in parts by weight,
   Photopolymer, about 50-100;
   Reactive diluent, 0 to about 0.1-10;
   Photoinitiator, about 0.1-10;
   Organic solvent, 0 to about 200;
   casting the mixture on a plate substrate;
   and drying the plate to remove solvent;
   wherein the photopolymer comprises a composition of the structure G—R—R$^1$—G, where
   R comprises B or E or mixtures thereof; and F;
   A is —CH$_2$CH$_2$—, —CH$_2$CH(CH$_3$)—, —CH$_2$CH$_2$CH$_2$CH$_2$—, —CH$_2$CH$_2$CH(CH$_3$)—, or —CH$_2$CH(CH$_3$)CH$_2$—;
   B is; ,
   D is, or —R—O—[C(:O)—(CH$_2$)$_5$—O—] and has a molecular weight of about 600-6000;
   E is,
   F is,
   G is CH$_2$=C(R$^9$)—C(:O)—O—R$^8$—O—C(:O)—NH—;
   R$^1$ is a divalent aromatic, aliphatic, or cycloaliphatic group containing 2-20 carbons;
   R$^2$ is a divalent aliphatic, cycloaliphatic, or alpharyl group of 2-20 carbons;
   R$^3$ is a divalent aliphatic, cycloaliphatic, aryl, or alpharyl group of 1-20 carbons;
   R$^4$ and R$^6$ are the same or different alkylene groups with 1-6 carbons; or R$^4$ can be —(CH$_2$CH$_2$O)$_d$CH$_2$CH$_2$—, provided R$^6$ is —(CH$_2$CH$_2$O)$_e$CH$_2$CH$_2$—, where d and e are each 0-9 and d+e=3-15;
   R$^5$ is —N(R$^7$)—, —N—, or —N(Ph)—;
   R$^7$ is an alkyl group with 1-6 carbons;
   R$^8$ is 1-7 carbon alkylene;
   R$^9$ is H or methyl;
   (A—O)$_b$ has a number average molecular weight of about 650-7000.

6. A printing plate made according to claim 5 wherein the mixture comprises Photopolymer, about 50-90; Reactive diluent, about 5-15; Photoinitiator, about 0.5-2.0; Organic solvent, about 10-50.

7. A printing plate made according to claim 6 wherein
   R$^1$ is tolylene or methylene diphenylene;
   R$^4$, R$^6$, and R$^8$ are ethylene;
   R$^7$ and R$^9$ are methyl;
   R$^5$ is —N(R$^7$)—;
   (A—O)$_b$ has a number average molecular weight of about 1000-3500.

8. A printing plate made according to claim 7 where (A—O)$_b$ is a moiety of polypropylene ether diol of molecular weight about 1000 or of a 3/1 molar polypropylene oxide/ethylene oxide end-capped diol, number average molecular weight about 1000.

9. A printing plate made by a method comprising exposing a printing plate comprising a layer of a photopolymer composition on a substrate with UV radiation through a negative, thereby providing exposed and non-exposed areas of photopolymer composition on the plate, and developing the plate by removing the non-exposed areas by washing the plate with an aqueous acidic solution; characterized in that the photopolymer composition comprises G—R—R$^1$—G, where R comprises B or E or mixtures thereof and F;

A is —CH$_2$CH$_2$—, —CH$_2$CH(CH$_3$)—, —CH$_2$CH$_2$CH$_2$CH$_2$—, —CH$_2$CH$_2$CH(CH$_3$)—, or —CH$_2$CH(CH$_3$)CH$_2$—;

B is;,

D is, or —R—O— and has a molecular weight of about 600-6000;

E is,

F is,

G is CH$_2$=C(R$^9$)—C(:O)—O—R$^8$—O—C(:O)—NH—;

R$^1$ is a divalent aromatic, aliphatic, or cycloaliphatic group containing 2-20 carbons;

R$^2$ is a divalent aliphatic, cycloaliphatic, or alpharyl group of 2-20 carbons;

R$^3$ is a divalent aliphatic, cycloaliphatic, aryl, or alpharyl group of 1-20 carbons;

R$^4$ and R$^6$ are the same or different alkylene groups with 1-6 carbons; or R$^4$ can be —(CH$_2$CH$_2$O)$_d$CH$_2$CH$_2$—, provided R$^6$ is —(CH$_2$CH$_2$O)$_e$CH$_2$CH$_2$—, where d and e are each 0-9 and d+e=3-15.

R$^5$ is —N(R$^7$)—, —N N—, or —N(Ph)—;

R$^7$ is an alkyl group with 1-6 carbons;

R$^8$ is 1-7 carbon alkylene;

R$^9$ is H or methyl;

(A—O)$_b$ has a number average molecular weight of about 650-7000.

10. A printing plate according to claim 9 wherein the aqueous acidic solution comprises dilute citric acid, acetic acid, formic acid, lactic acid, ascorbic acid, tartanic acid, acidic surfactant, or mixtures thereof.

11. A printing plate made according to claim 9 where the photopolymer composition comprises, in parts by weight, Photopolymer, about 50-100;
Acrylate diluent, 0 to about 25;
Photoinitiator, about 0.1-10.

12. A printing plate made according to claim 11 where the photopolymer composition comprises Photopolymer, about 70-90;
Acrylate diluent, about 5-10;
Photoinitiator, about 0.5-2.0.

13. A printing plate made according to claim 11 where

R$^1$ is tolylene or methylene diphenylene;
R$^4$, R$^6$ and R$^8$ are ethylene;
R$^7$ and R$^9$ are methyl;
R$^5$ is —N(R$^7$)—;
(A—O)$_b$ has a number average molecular weight of about 1000-3500.

14. A printing plate made according to claim 11 where

R comprises B and E and F;
R$^1$ is methylene diphenylene or modified methylene diphenylene
R$^4$, R$^6$, and R$^8$ are ethylene;
R$^7$ and R$^9$ are methyl;
R$^5$ is —N(R$^7$)—;
(A—O)$_b$ is a polypropylene oxide/ethylene oxide end-capped diol, and has a number average molecular weight of about 3000;
D is polypropylene adipate and has a number average molecular weight of about 2400.

15. A printing plate made according to claim 13 where (A—O)$_b$ is a moiety of polypropylene ether diol of number average molecular weight about 1000 or of a 3/1 molar polypropylene oxide/ethylene oxide end-capped diol, number average molecular weight about 1000.

* * * * *